US008376236B2

(12) United States Patent
Ozawa et al.

(10) Patent No.: US 8,376,236 B2
(45) Date of Patent: Feb. 19, 2013

(54) CONTACTLESS IC LABEL

(75) Inventors: Tatsurou Ozawa, Kawasaki (JP);
Hidemi Nakajima, Koshigaya (JP);
Kozue Furuichi, Kasukabe (JP);
Hidehiko Kando, Yokohama (JP); Shin Kataoka, Yokohama (JP)

(73) Assignees: Toppan Printing Co., Ltd., Tokyo (JP);
Hitachi, Ltd., Tokyo (JP)

( * ) Notice: Subject to any disclaimer, the term of this patent is extended or adjusted under 35 U.S.C. 154(b) by 0 days.

(21) Appl. No.: 13/129,268

(22) PCT Filed: Nov. 13, 2009

(86) PCT No.: PCT/JP2009/006098
§ 371 (c)(1),
(2), (4) Date: Aug. 1, 2011

(87) PCT Pub. No.: WO2010/055683
PCT Pub. Date: May 20, 2010

(65) Prior Publication Data
US 2011/0290892 A1 Dec. 1, 2011

(30) Foreign Application Priority Data

Nov. 14, 2008 (JP) ................................ P2008-292522

(51) Int. Cl.
*G06K 19/02* (2006.01)
*G06K 7/08* (2006.01)
*G06K 19/06* (2006.01)

(52) U.S. Cl. ........ 235/488; 235/375; 235/380; 235/451; 235/492

(58) Field of Classification Search ................. 235/375, 235/380, 451, 492, 488
See application file for complete search history.

(56) References Cited

U.S. PATENT DOCUMENTS

| 6,900,767 | B2 * | 5/2005 | Hattori | 343/702 |
|---|---|---|---|---|
| 2003/0132302 | A1 * | 7/2003 | Hattori | 235/492 |
| 2004/0031855 | A1 * | 2/2004 | Takahashi | 235/492 |
| 2004/0129788 | A1 * | 7/2004 | Takahashi et al. | 235/492 |
| 2005/0040243 | A1 * | 2/2005 | Bi et al. | 235/492 |

(Continued)

FOREIGN PATENT DOCUMENTS

| JP | 2001-5934 | 1/2001 |
|---|---|---|
| JP | 2002-042088 | 2/2002 |

(Continued)

OTHER PUBLICATIONS

International Search Report, dated Feb. 16, 2010 in PCT/JP2009/006098.

(Continued)

*Primary Examiner* — Tuyen K Vo

(57) ABSTRACT

A contactless integrated circuit (IC) label has an IC chip and is capable of exchanging data with an external reading device without contact. The contactless IC label includes: a transparent label base material; an optical variable device formed on a lower surface of the label base material; a conductive layer bonded to and formed on a lower surface of the optical variable device, and configured to function as an antenna of the IC chip; a connecting layer electrically connected to the IC chip; an insulating layer formed between the conductive layer and the connecting layer, and configured to electrically couple the conductive layer and the connecting layer; and an impedance adjusting unit formed on at least the connecting layer of the conductive layer and the connecting layer, and configured to adjust impedances of the conductive layer and the IC chip.

12 Claims, 17 Drawing Sheets

U.S. PATENT DOCUMENTS

| | | | |
|---|---|---|---|
| 2007/0029384 A1* | 2/2007 | Atherton | 235/435 |
| 2007/0214637 A1* | 9/2007 | Nakanishi et al. | 29/831 |
| 2008/0036673 A1* | 2/2008 | Yamagajo et al. | 343/793 |
| 2008/0149731 A1* | 6/2008 | Arai et al. | 235/492 |
| 2008/0283616 A1* | 11/2008 | Yukawa et al. | 235/492 |
| 2008/0308641 A1* | 12/2008 | Finn | 235/492 |
| 2009/0242506 A1* | 10/2009 | Nakamura et al. | 216/13 |
| 2009/0302120 A1* | 12/2009 | Omura et al. | 235/492 |

FOREIGN PATENT DOCUMENTS

| | | |
|---|---|---|
| JP | 2003-46627 | 2/2003 |
| JP | 2003-308510 | 10/2003 |
| JP | 2007-311955 | 11/2007 |
| JP | 2008-197714 | 8/2008 |
| JP | 2008-217406 | 9/2008 |
| WO | WO 2008/038672 | 4/2008 |

OTHER PUBLICATIONS

PCT Request, Form PCT/RO/101, pp. 1-6.
Search Report and Written Opinion, Forms PCT/ISA/210, PCT/ISA/220 and PCT/ISA/237.
Published PCT Application, WO 2010/055683 A1, dated May 20, 2010.
PCT Notification Concerning Submission of Transmittal of Priority Document, Form PCT/IB/304), dated Nov. 14, 2008, (1 page).

* cited by examiner

FIG. 16

| RESIN FRACTION | Tg (HEAT RESISTANT TEMPERATURE) | ADHESION (gf) | HOLOGRAM WHITENING AND BASE MATERIAL CONTRACTION |
|---|---|---|---|
| NO SHIELDING LAYER | — | 300 | × |
| POLYESTER | 70 | 49.1 | × |
| ACRYL | 105 | 374.8 | × |
| EPOXY RESIN | 200 | 1045.1 | ○ |
| CROSS-LINKED URETHANE RESIN | 180 | 875.4 | ○ |

CONTACTLESS IC LABEL

CROSS REFERENCE TO RELATED APPLICATIONS

This application is a national phase application, under 35 U.S.C. 371, of international application No. PCT/JP2009/0046098, filed on Nov. 13, 2009, which claimed priority to Japanese Patent Application No. 2008-292522, filed on Nov. 14, 2008, the disclosures of which are incorporated herein by reference.

TECHNICAL FIELD

The present invention relates to a contactless integrated circuit (IC) label, which has an optical variable device representing an optical visual effect and is capable of transmitting and receiving data to and from an external data reading device without contact.

BACKGROUND ART

Heretofore, contactless IC labels having an IC chip and an antenna have been used for merchandise control at retail stores or rental stores. This merchandise control involves attaching the contactless IC label to a commodity to be managed which is used as an adherend, and reading/writing data stored in the IC chip using a dedicated data reading/writing device to thereby perform ingress/egress control, inventory control, loan control, and so forth of the commodities. Due to the IC chip, a commodity code as well as an abundant amount of information such as an arrival date and a manager can be integrally managed with the commodity. Particularly, as for article control, contactless IC labels using microwaves are frequently used because they have a long communication distance of 1 to 2 m compared to contactless IC labels using electrostatic coupling or electromagnetic induction.

Further, as the contactless IC label comes into wide use, it is expected to combine an optical variable device (hereinafter referred to as "OVD") with the contactless IC label. OVD is a generic name of holograms or diffraction gratings that can represent a 3-dimensional image or a special decoration image using the interference of light, and multilayered thin films that cause the variation of a color depending on a viewing angle by superposing thin films having different optical characteristics. Since these OVDs make a special impression on the 3-dimensional image or the color variation, they have an excellent decorative effect, and thus are used for ordinary prints such as various packing materials or picture books, catalogs, and so forth. Furthermore, since the OVD requires advanced manufacturing technology, it is used as anti-counterfeit means for credit cards, securities, certified documents, and so forth.

When the above-described contactless IC label is combined with the OVD, a data reading/writing function of the contactless IC label is combined with an anti-counterfeit function or a decorative effect of the OVD. Thereby, it is possible to realize a higher level of anti-counterfeit effect, and to construct a label combining the anti-counterfeit effect or the decorative effect with a merchandise control function.

As one example, a contactless data transceiver is proposed in which a hologram is formed at a required position on a sheet metal having a conductive metal layer, and the conductive metal layer is used as an antenna pattern (e.g. see Patent Document 1).

Patent Document 1: Japanese Unexamined Patent Application, First Publication No. 2002-42088

DISCLOSURE OF INVENTION

Problem to be Solved by the Invention

In the contactless data transceiver disclosed in Patent Document 1, in order to further increase the beauty to produce a design effect when attached to an article, the metallic conductive layer is expected to be formed in a desired planar shape such as a butterfly or a flower.

However, if the planar shape of the conductive layer varies, impedance of the conductive layer varies as well. As such, the impedance is unmatched with internal impedance of a mounted IC chip. In this case, when the conductive layer is merely connected with the IC chip, a communication distance becomes short, or communication itself becomes impossible. Accordingly, it is difficult to realize desired communication characteristics.

The present invention has been made in view of the above-described circumstances, and an object of the invention is to provide a contactless IC label capable of maintaining good communication characteristics even when a conductive layer is formed in a desired shape.

Means for Solving the Problem

According to a first aspect of the present invention, there is provided a contactless integrated circuit (IC) label that has an IC chip and is capable of exchanging data with an external reading device without contact. The contactless IC label includes: a transparent label base material; an optical variable device formed on a lower surface of the label base material; a conductive layer bonded to and formed on a lower surface of the optical variable device, and configured to function as an antenna of the IC chip; a connecting layer electrically connected to the IC chip; an insulating layer formed between the conductive layer and the connecting layer, and configured to electrically couple the conductive layer and the connecting layer; and an impedance adjusting unit formed on at least the connecting layer of the conductive layer and the connecting layer, and configured to adjust impedances of the conductive layer and the IC chip.

Meanwhile, the term "lower surface" refers to a surface of the contactless IC label which is opposite to an adherend such as an article when the contactless IC label is adhered to the adherend.

According to the contactless IC label of the present invention, since impedance unmatching between the IC chip and the conductive layer is removed by an impedance adjusting unit, it is possible to maintain communication characteristics of the contactless IC label at a fixed level regardless of a shape of the conductive layer.

The impedance adjusting unit may include a first loop circuit formed by a cutout that is formed in the connecting layer. In this case, as a shape of the cutout varies, it is possible to easily cope with variation in shape of the conductive layer.

The impedance adjusting unit may include a second loop circuit formed by the connecting layer, the conductive layer, and a capacitive coupler configured to electrically connect the connecting layer and the conductive layer.

The second loop circuit may be longer than or equal to the first loop circuit.

The contactless IC label may further include an insulating shielding layer formed between the conductive layer and the connecting layer, the insulating shielding layer making the connecting layer invisible when viewed from the label base material side under visible rays. In this case, it is possible to further improve an appearance of the contactless IC label without the connecting layer damaging an appearance of the conductive layer.

The IC chip may record a non-rewritable identification code. In this case, it is possible to further improve security.

The contactless IC label may further include a release layer formed between the label base material and the optical variable device.

The shielding layer may be formed of a material whose heatproof temperature is 180° C. or more.

The conductive layer may have a thickness greater than or equal to 10 nm and less than 1 μm; and the connecting layer may have a thickness ranging from 1 μm to 20 μm.

According to a second aspect of the present invention, there is provided an article to which a contactless integrated circuit (IC) label is adhered. The contactless IC label include: a transparent label base material; an optical variable device formed on a lower surface of the label base material; a conductive layer bonded to and formed on a lower surface of the optical variable device, and configured to function as an antenna of the IC chip; a connecting layer electrically connected to the IC chip; an insulating layer formed between the conductive layer and the connecting layer, and configured to electrically couple the conductive layer and the connecting layer; and an impedance adjusting unit formed on at least the connecting layer of the conductive layer and the connecting layer, and configured to adjust impedances of the conductive layer and the IC chip.

According to the article of the present invention, it is possible to provide a high design effect due to the contactless IC label as well as to realize good communication characteristics regardless of the shape of the conductive layer.

Effect of the Invention

According to a contactless IC label of the present invention, even when a conductive layer is formed in a desired shape, it is possible to maintain good communication characteristics.

BRIEF DESCRIPTION OF THE DRAWINGS

FIG. 16 is a graph showing heatproof temperature, adhesion, and information about the whitening of a hologram and the contraction of a base material when a predetermined resin is used as the shielding layer 8.

BEST MODE FOR CARRYING OUT THE INVENTION

First Embodiment

Hereinafter, a contactless integrated circuit (IC) label (hereinafter simply referred to as an "IC label") according to a first embodiment of the present invention will be described with reference to FIGS. 1 to 8.

Figure 1:
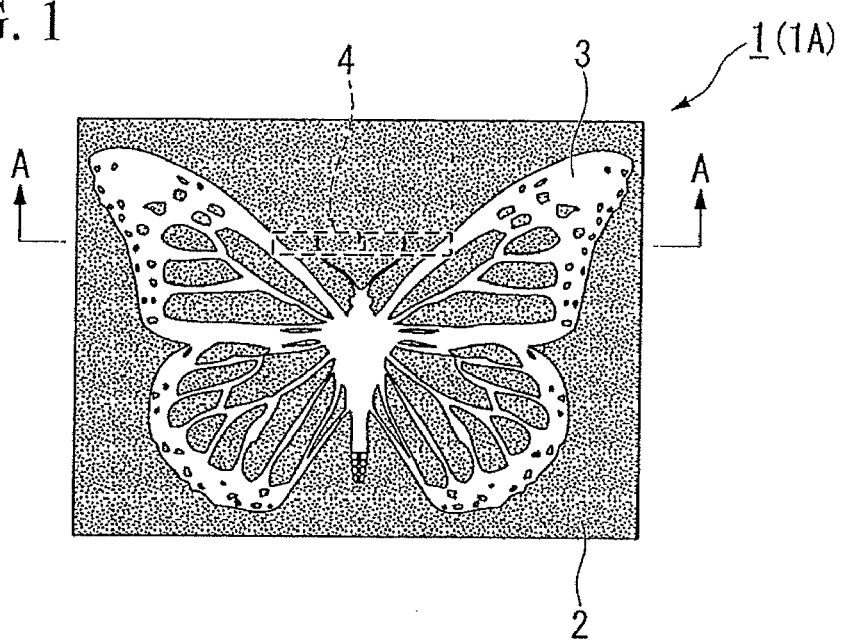
FIG. 1 is a plan view showing a contactless IC label according to a first embodiment of the present invention.
Figure 2:
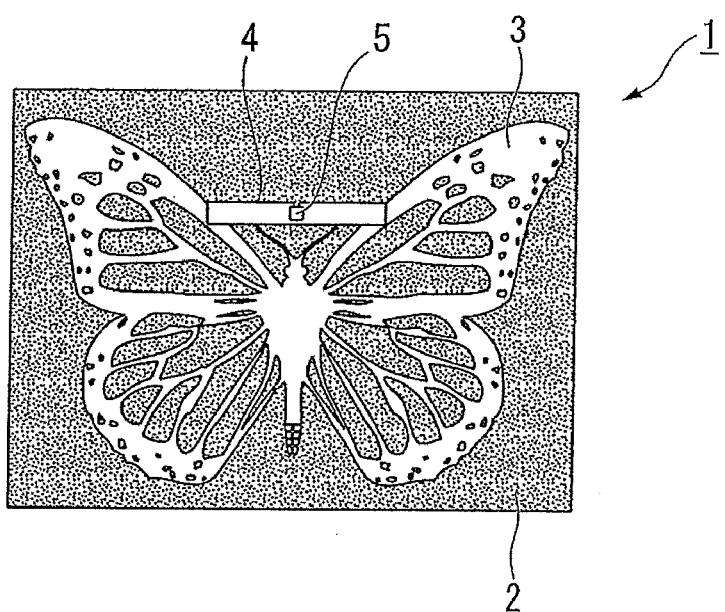
FIG. 2 is a bottom view of the contactless IC label.

FIG. 1 is a plan view showing the IC label 1 of the present embodiment. FIG. 2 is a bottom view of the IC label 1. As shown in FIGS. 1 and 2, the IC label 1 includes a label base material 2, a conductive layer 3, a connecting layer 4, and an IC chip 5.

The label base material 2 is a transparent base material formed on a surface of the IC label 1.

The conductive layer 3 is formed on a lower surface of the label base material 2. Meanwhile, the lower surface refers to a surface that faces an adherend when the IC label 1 is adhered to the adherend. Hereinafter, a similar surface at each layer is referred to as the "lower surface." The conductive layer 3 functions as a radiating element of a dipole antenna or a loop antenna.

The connecting layer 4 is formed on a lower surface of the conductive layer 3. Since the conductive layer 3 is thin compared to a typical antenna, the connecting layer 4 is used. The connecting layer 4 is formed by printing using conductive ink containing conductive particles, by a conductor such as copper or aluminum formed on a film made of polyethylene terephthalate (PET) or polyethylene naphthalate (PEN), by performing hot stamping on a conductor such as copper or aluminum, or by adhering a conductor such as copper or aluminum previously formed on a base material such as PET or paper.

The IC chip 5 is mounted on the connecting layer 4. The connecting layer 4 electrically connected with the IC chip 5 functions as a tag. However, it is possible to further improve communication performance (communication distance) by deposition of the conductive layer 3.

The label base material 2 is formed of a transparent resin so that the conductive layer 3 is visible. In detail, the transparent resin may properly employ a transparent sheet-like material formed of a resin such as PET, polyvinyl chloride (PVC), acrylonitrile-butadiene-styrene copolymer synthetic resin (ABS), or the like. Further, if the conductive layer 3 below the label base material 2 is visible, the label base material 2 may not necessarily be colorless, and may be formed of a colored material having transparency.

Figure 3:
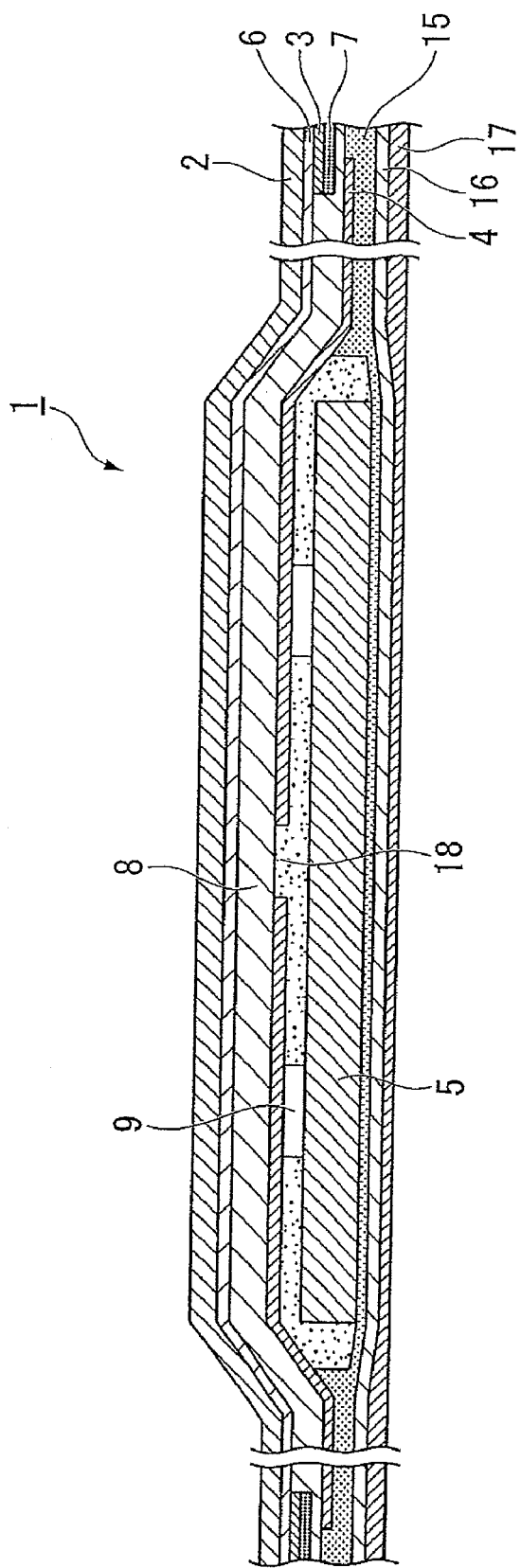
FIG. 3 is a cross-sectional view taken along line A-A of FIG. 1.

FIG. 3 is a cross-sectional view taken along line A-A of FIG. 1. A functional layer 6 functioning as an optical variable device (OVD) is formed on a surface of the label base material 2 which faces the conductive layer 3. The functional layer 6 has a layered structure in which a 3-dimensional image is represented or a color shift in which a color varies with a viewing angle is generated. The functional layer 6 is formed by a known method using one appropriately selected from a relief or volumetric type hologram, a diffraction grating image such as a grating image or a pixelgram where a plurality of kinds of diffraction gratings are arranged as pixels, a thin film laminate of a ceramic or metal material generating the color shift, and so forth.

Among them, the relief type hologram (diffraction grating) or the multilayered thin film is preferable when mass productivity or costs are taken into consideration.

The conductive layer 3 is formed as a deposition film by depositing a metal such as aluminum on the functional layer 6. The conductive layer 3 is formed in a desired shape by performing a demetallization process of covering with a mask layer (an insulating layer) 7 formed of polyamide-imide in a desired shape and partially removing the metal deposition, thereby making it possible to enhance design. In the IC label 1 of the present embodiment, as shown in FIGS. 1 and 2, the conductive layer 3 is formed in a butterfly shape by way of example.

The conductive layer 3 is electrically coupled with the connecting layer 4 with the mask layer 7 interposed therebetween. As a result, the conductive layer 3 and the IC chip 5 are electrically connected to each other, so that contactless communication of the IC chip 5 becomes possible, and the visual effect produced by the functional layer 6 is enhanced. Further, the electrical coupling used herein includes capacitive coupling, magnetic coupling, and direct coupling. The direct coupling is realized, for instance, by a conductive adhesive, a conductive paste, ultrasonic fusion, resistance welding, laser welding, or the like. The visual effect of the functional layer 6 is visible, if not satisfactory, even when the conductive layer 3 is not disposed under the functional layer 6. Particularly, when the functional layer 6 is a relief hologram or a diffraction grating, the conductive layer 3 is disposed under the functional layer 6, thereby making it possible to enhance the visual effect of these layers. This results in obtaining beautiful design as well as producing an anti-counterfeit effect.

A shielding layer 8 is formed on a region where the conductive layer 3 is not formed on a lower surface of the mask layer 7 and a lower surface of the label base material 2 in order to make the connecting layer 4 invisible under visible light when viewed from the upper surface of the IC label 1 (i.e., when viewed from the top). As the shielding layer 8, a black ink printed layer can be preferably employed, but a layer having a different color may be employed. Further, if a material such as ink of which the shielding layer 8 is formed is adequately selected, it is possible to adequately fix the connecting layer 4 formed thereon.

The metallic conductive layer 3 for producing a design effect of the OVD is generally formed by deposition. In this case, the conductive layer 3 is a thin film having a thickness ranging from tens of nm to hundreds of nm. When the IC chip 5 is mounted on this thin film, a connecting portion of the IC chip 5, such as a bump, breaks through the thin film and interrupts electrical conduction due to pressure applied on mounting, so that electrical disconnection occurs.

As in the embodiment of the present invention, the IC chip 5 is connected to the conductive connecting layer 4 having a certain thickness, and thus the connecting layer 4 and the metallic conductive layer 3 are electrically connected to each other, so that stable connection can be made.

Preferably, the thickness of the conductive layer 3 is more than or equal to 10 nm and less than 1 μm, and more preferably ranges from 20 nm to 200 nm.

The thickness of the connecting layer 4 preferably ranges from 1 μm to 20 μm, and more preferably from 2 μm to 10 μm.

Figure 4:
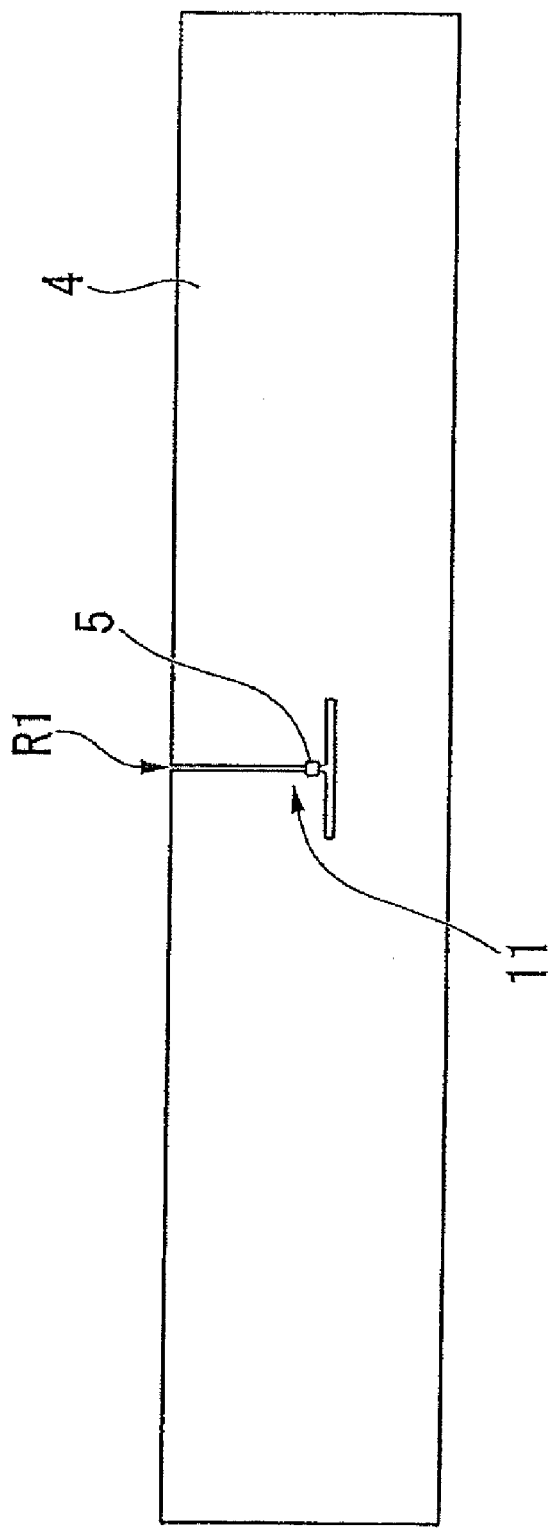
FIG. 4 is an enlarged view showing a connecting layer and an IC chip of the contactless IC label.

FIG. 4 is an enlarged view showing the connecting layer 4 and the IC chip 5. The connecting layer 4, which electrically connects the IC chip 5 and the conductive layer 3, is printed on a lower surface of the shielding layer 8 by a known method, for instance in a strip shape as shown in FIG. 2, using conductive ink containing conductive particles. As the conductive ink, silver paste may be preferably used. As shown in FIG. 2, ends of the connecting layer 4 are formed so as to overlap the conductive layer 3 when viewed from the top, and simultaneously an IC chip mounting portion and an impedance adjusting unit 11 of the connecting layer 4 are formed so as not to overlap the conductive layer 3 when viewed from the top.

The IC chip 5 is formed of single crystal silicon. As shown in FIG. 3, the IC chip 5 is mounted so that bumps 9 are electrically connected to the connecting layer 4 by adhering the bumps 9 under heat and pressure using an anisotropic conductive paste (ACP) 18. The IC chip 5 may be mounted on the connecting layer 4 by ultrasonic mounting, instead of the mounting using the ACP 18.

The conductive layer 3 and the connecting layer 4 are electrically connected by capacitive coupling using the insulating mask layer 7 and the shielding layer 8 interposed therebetween as dielectrics, and the IC chip 5 can perform radio-based contactless communication with an external reading device. A frequency available for the communication between the IC chip 5 and the external reading device includes a microwave band (2.45 GHz or more) and a UHF wave band (850 to 950 MHz). When the microwave band is used, it is possible to further reduce dimensions of the connecting layer 4 and the conductive layer 3 and thus to further miniaturize the IC label 1.

As shown in FIG. 4, the IC chip 5 is mounted on a region R1 adjacent to the longitudinal middle of the lower surface of the strip-shaped connecting layer 4, and lengths of the connecting layer 4 extending toward opposite sides of the IC chip 5 are nearly equal to each other. The impedance adjusting unit 11 is formed around the IC chip 5 in order to adjust impedance of the conductive layer 3 to be equal to internal impedance of the IC chip 5. Further, the impedance used herein refers to only impedance of the imaginary part.

Figure 5:
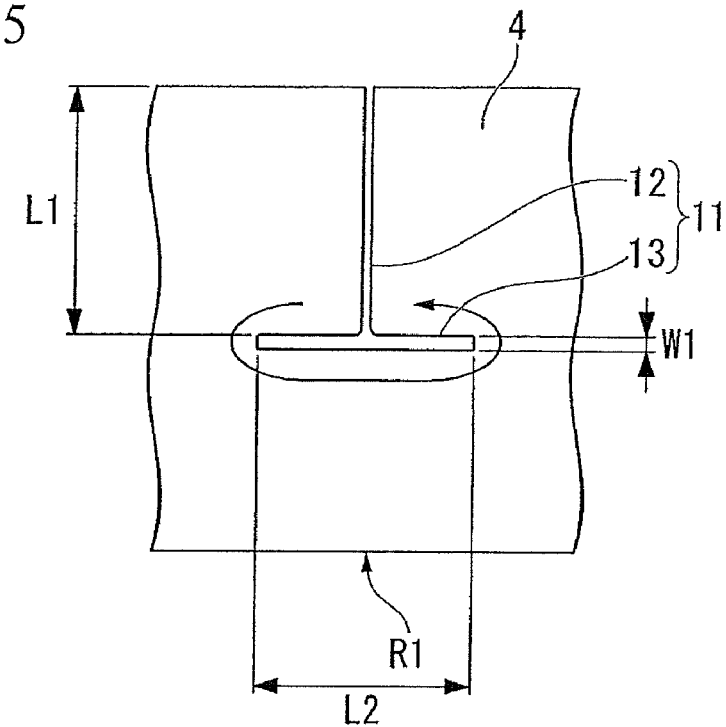
FIG. 5 is an enlarged view showing the periphery of a portion where the IC chip of the contactless IC label is mounted.

As further enlarged in FIG. 5, the impedance adjusting unit 11 is made up of two slits: a first slit 12 extending in a widthwise direction of the connecting layer 4 and a second slit 13 extending in a longitudinal direction of the connecting layer 4. Further, in FIG. 5, for clarity of the figure, the IC chip 5 is removed.

The first slit 12 is formed so as not to divide the connecting layer 4 into two parts. To this end, the first slit 12 extends in the widthwise direction of the connecting layer 4 from one end in the widthwise direction of the connecting layer 4, and comes to an end at an arbitrary position in front of the other end. The second slit 13 is formed so as to communicate with the first slit 12. The IC chip 5 is mounted on the connecting layer 4 so that the bumps 9 are located on opposite sides between which the first slit 12 is sandwiched.

As for the IC chip 5 mounted in this way and the connecting layer 4, as shown in FIG. 5 by an arrow D1, the connecting layer on the side of the second slit 13 rather than the mounted IC chip forms a loop having a coil shape, and a loop of electric current flowing from one bump 9 to the other bump 9 through the corresponding loop is formed. Since reactance generated by this electric current varies due to the shape of the impedance adjusting unit 11, the impedance of the conductive layer 3 can be matched with the impedance of the IC chip 5 by properly changing the shape of the impedance adjusting unit 11.

Since the impedance of the conductive layer 3 varies due to its shape, the shape of the impedance adjusting unit 11 is also required to be properly changed depending on the variation. In detail, an available communication distance with the external reading device is measured while properly changing parameters such as a length L1 of the first slit 12, a length L2 and a width W1 of the second slit 13, and a mounting position of the IC chip 5 in the longitudinal direction of the first slit 12. Thereby, it is possible to set each parameter value capable of realizing a desired communication characteristic, and thus to determine the shape of the impedance adjusting unit 11.

In addition, the communication characteristic of the IC label 1 also varies depending on a dielectric constant of the adherend to which the IC label 1 is adhered or a positional relationship of the connecting layer 4 relative to the conductive layer 3. Accordingly, when the shape of the impedance adjusting unit 11 is determined, the shape of the impedance adjusting unit 11 may be determined by performing the above test while changing the shape of the impedance adjusting unit 11 or the positional relationship of the connecting layer 4 relative to the conductive layer 3 in the state where the IC label 1 is actually adhered to the adherend.

Further, as the IC chip 5, one in which an individually different identification code (unique ID, hereinafter referred to as "UID") is recorded in a non-rewritable format may be used. Use of this IC chip allows traceability of the IC chip (or the IC label having the IC chip attached thereto) to be realized and security to be improved by reading and using the UID.

As this IC chip, a trade mark "μ-chip" (available from Hitachi, Co. Ltd.) may be appropriately employed. The μ-chip is also favorable in miniaturization of the IC label 1, because its communication frequency uses a microwave band of 2.45 GHz or more.

Returning to the description of FIG. 3, a resin sheet 16 is formed below the shielding layer 8 including the IC chip 5 and the connecting layer 4 via an adhesive layer 15. Furthermore, another adhesive layer 17 is formed under the resin sheet 16, so that the lower surface of the IC label 1 can be adhered to adherends such as a variety of articles.

If necessary, a separator such as a release paper may be attached to the adhesive layer 17, so that the adhesive layer 17 can be protected until it is adhered to the adherend.

The IC label 1 configured as described above may be manufactured, for instance, in the following procedure. In detail, the functional layer 6 is formed on the lower surface of the label base material 2, and a metal deposition film which forms the conductive layer 3 is provided on the lower surface of the functional layer 6. Next, the conductive layer 3 is formed in a desired shape using the mask layer 7. Further, the shielding layer 8 and the connecting layer 4 are sequentially provided on the lower surface of the conductive layer 3 by printing. The IC chip 5 is mounted on the connecting layer 4. Finally, the adhesive layer 15, the resin sheet 16, and the adhesive layer 17 are provided. Thereby, the IC label 1 is completed.

Further, with regard to the shielding layer 8 and the connecting layer 4, for example, the shielding layer 8 is printed first by a multicolor screen printer, and then the connecting layer 4 is printed, A drying process is performed immediately after the printing. Thereby, these layers can be efficiently manufactured.

The IC label 1 of the present embodiment described above will be further described using Examples and Comparative Examples.

Example 1

As a label base material 2, a PET sheet having a thickness of 50 micrometers (μm) was used. A functional layer 6 was formed on a lower surface of the label base material 2, and then a conductive layer 3 was formed using deposition and a mask layer 7, as shown in FIG. 1. Here, the conductive layer 3 was a thin film made of aluminum, and was formed in a butterfly shape (hereinafter referred to as "design Z1") having a longitudinal dimension of about 26 millimeters (mm). To cover entire lower surfaces of the functional layer 6 and the conductive layer 3, a shielding layer 8 formed of an India ink print having a thickness of 4 μm was formed by printing.

Furthermore, a connecting layer 4 having a longitudinal dimension of 15 mm, a widthwise dimension of 4 mm, and a thickness of 6 μm was formed of silver paste by printing. An impedance adjusting unit 11 was dimensioned based on a test made in advance so that a length L1 of a first slit 12, a length L2 of a second slit 13, and a width W1 of the second slit 13 were set to 2.5 mm, 5.0 mm, and 0.3 mm, respectively. The second slit 13 was set so that the longitudinal middle thereof was connected with the first slit 12.

After the connecting layer 4 was formed, the aforementioned μ-chip was mounted as an IC chip 5 on a lower surface of the connecting layer 4 using an anisotropic conductive material. The IC chip 5 was mounted at a position where it was spaced 2.0 mm from an end of the first slit 12 on the side of an opening of the first slit 12 (i.e. a portion connected with a widthwise end of the connecting layer 4). Further, a PET film having a thickness of 10 μm was attached as a resin sheet 16 via an adhesive layer 15 having a thickness of 20 µm, and an adhesive layer 17 having a thickness of 20 µm was provided. Thereby, an IC label 1A of the present example was obtained.

Comparative Example 1

An IC label of Comparative Example 1 was prepared in nearly the same procedure as in Example 1 described above. However, the impedance adjusting unit 11 was not formed on the connecting layer 4. The mounting position of the IC chip 5 was similar to that of Example 1.

Example 2

Figure 6:
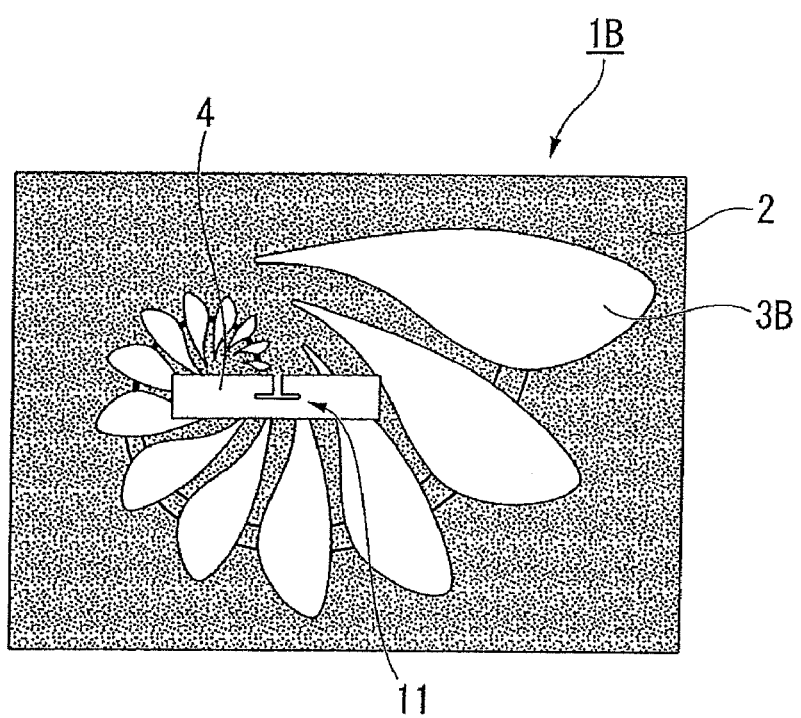
FIG. 6 is a view showing an example of the contactless IC label.

An IC label 1B of Example 2 was prepared in roughly the same procedure as the IC label of Example 1. However, a conductive layer 3B was shaped so that a snail as shown in FIG. 6 was used as a motif (hereinafter, referred to as "design Z2"). In FIG. 6, the conductive layer 3B had a longitudinal dimension of about 30 mm.

As the shape of the conductive layer varies from the design Z1 to the design Z2, the impedance of the conductive layer varies. As such, the shape of the impedance adjusting unit 11 was set so as to be different from that of Example 1. In detail, the impedance adjusting unit 11 was dimensioned based on the test made in advance so that the length L1 of the first slit 12, the length L2 of the second slit 13, and the width W1 of the second slit 13 were set to 2.5 mm, 4.0 mm, and 0.3 mm, respectively. The IC chip 5 (not shown) was mounted on the connecting layer 4 using an ACP 18 (not shown). The IC chip 5 was mounted at a position where it was spaced 2.0 mm from the end of the first slit 12 on the side of the opening of the first slit 12.

Comparative Example 2

An IC label of Comparative Example 2 was prepared in the same procedure as in Example 2, except that the impedance adjusting unit 11 was not formed.

In each of Examples 1 and 2 and Comparative Examples 1 and 2 prepared as described above, the communication characteristics were reviewed. As a reader (a reading device), a handy-type reader (trade mark R001M, available from Sekonic Co. Ltd.) was used. The reader read out the communication distance 100 times, all of which were successful (a reading rate of 100%). The read communication distance was measured by a height gauge, and was set as the communication distance. Further, the review of the communication characteristics was performed in three patterns: when the IC label was not adhered to the adherend; when a glass (a dielectric constant of 4.5) having a thickness of 1.2 mm was adhered to the adherend; and when a PET sheet (a dielectric constant of 2.9) having a thickness of 2 mm was adhered to the adherend. The results are shown in the table of FIG. 7.

Figure 7:
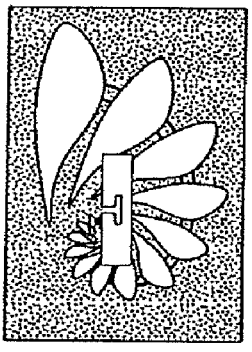
FIG. 7 is a table showing results of using Examples of the present invention and Comparative Examples.

As shown in the table of FIG. 7, in comparison with Comparative Examples in which the impedance adjusting unit 11 was not formed, it was ascertained from any one of Example 1 for the design Z1 and Example 2 for the design Z2 that the communication distance was increased, and the communication characteristics were improved. Further, its effect was produced on any pattern although it had a slight difference depending on a kind of the adherend. Particularly, when the adherend was glass, the communication was impossible in Comparative Example 2 (i.e. the communication distance was 0 mm), but was possible in Example 2. Thus, it was ascertained that the effect of Example 2 was remarkable.

According to the IC label of the present embodiment, since the impedance adjusting unit 11 is formed on the connecting layer 4, the impedance of the conductive layer 3 can be matched with the impedance of the IC chip 5 in whatever shape the conductive layer 3 is formed in order to enhance the design effect. Accordingly, the IC label of the present embodiment can be formed as an IC label that has a high design effect providing excellent beauty while realizing desired communication characteristics, and confer high security or traceability by adhesion to a target article.

Further, since the impedance adjusting unit 11 is made up of the two slits, the first slit 12 and the second slit 13, the impedance can be easily adjusted by appropriately changing the length or width of each of the slits 12 and 13.

Further, the connecting layer 4 is formed by printing using conductive ink, such as silver paste, containing conductive particles. As such, after the shape of the impedance adjusting unit 11 is determined by a test, a printing plate of the connecting layer 4 corresponding to such a shape is manufactured. In this case, the connecting layer having the same shape can be efficiently formed in quantities. Accordingly, it is possible to efficiently manufacture the IC label 1 at a low cost. Further, it is difficult to separate the connecting layer 4 and the IC chip 5 from the conductive layer 3 without destruction of the connecting layer 4 and the IC chip 5, so that the IC label 1 can be formed as an IC label for which it is difficult to commit fraud such as counterfeit.

Furthermore, since the shielding layer 8 is formed between the transparent label base material 2 and the connecting layer 4, it is impossible to look at the connecting layer 4 from the surface of the IC label 1 when the IC label 1 is adhered to the adherend. That is, only the conductive layer 3 formed in a desired shape and the functional layer 6 serving as the OVD formed on the surface of the conductive layer 3 are seen by users. Accordingly, it is possible to construct the IC label in which the design and the security are compatible with each other to a high level without the connecting layer 4 damaging the design or beauty of the conductive layer 3 or the functional layer 6.

Figure 8:
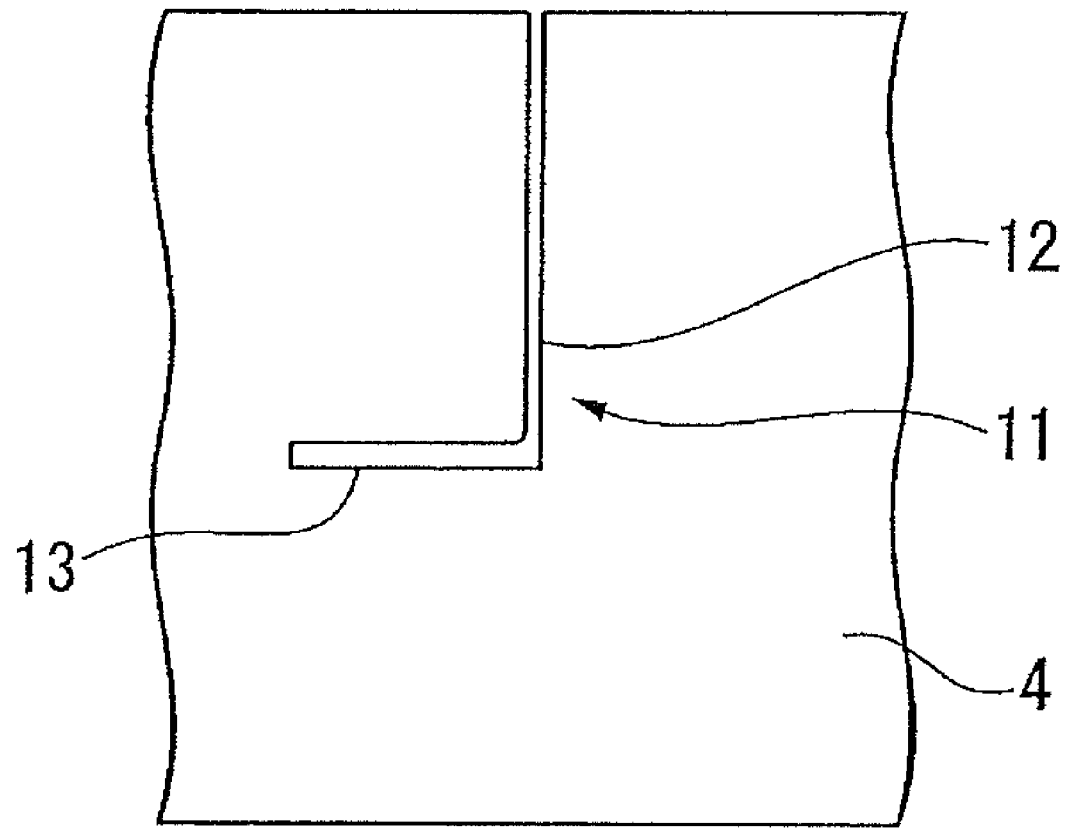
FIG. 8 is an enlarged view showing the periphery of a portion where the IC chip of a connecting layer is mounted in a contactless IC label according to an modification of the present invention.

For example, in each Example described above, the description has been made with reference to the example where the first slit 12 is connected with the second slit 13 at approximately the longitudinal middle of the second slit 13 and the impedance adjusting unit 11 is formed in approximately a T shape. However, the shape of the impedance adjusting unit 11 is not limited to this shape. As one example, as shown in FIG. 8, an end of the first slit 12 may be connected with an end of the second slit 13, and the impedance adjusting unit 11 may be formed in approximately an L shape. Further, the first slit 12 may not be orthogonal to the second slit 13.

Second Embodiment

Next, a second embodiment of the present invention will be described. In the second embodiment, parts similar to those of the first embodiment will not be described. A contactless IC label of the second embodiment is similar in configuration to that of the first embodiment (see FIG. 1).

Figure 9:
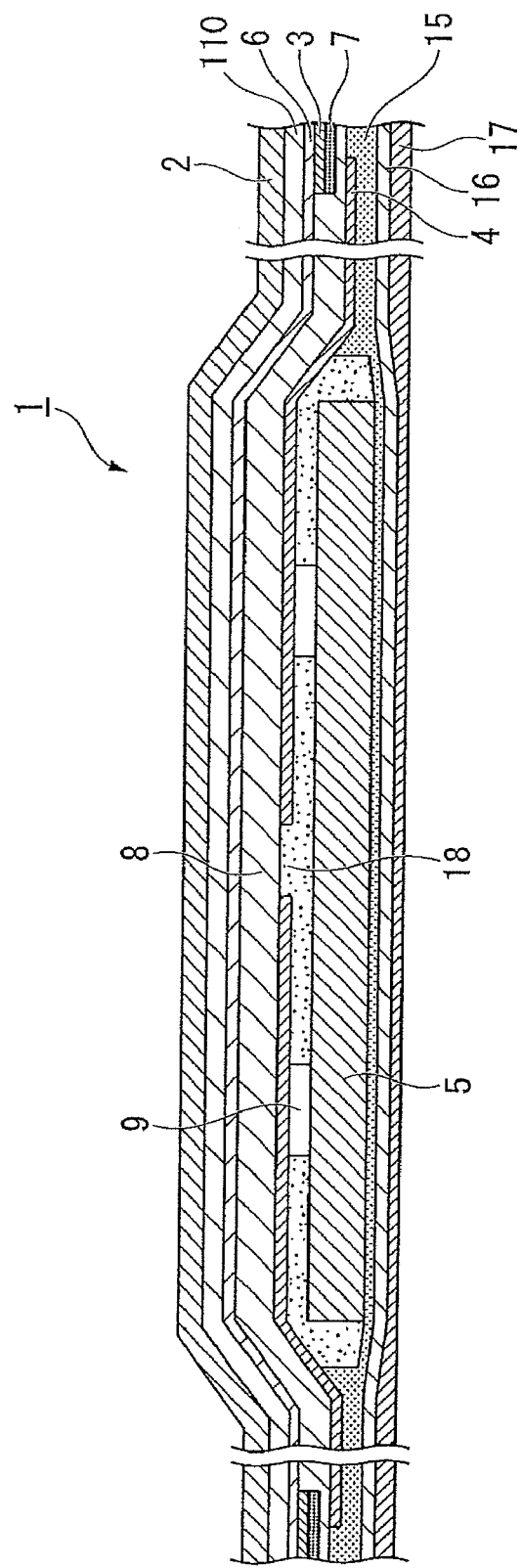
FIG. 9 is a cross-sectional view taken along line A-A of a contactless IC label 1 according to a second embodiment of the present invention.

FIG. 9 is a cross-sectional view taken along line A-A of a contactless IC label of the second embodiment of the present invention. The second embodiment is different from the first embodiment (FIG. 3) in that a release layer 110 is formed between the label base material 2 and the functional layer 6.

The release layer is a layer released from a supporting body, and a material used therefor includes an organic polymer resin such as a thermoplastic resin, a thermosetting resin, or an ultraviolet or electron-beam curing resin. For example, a thermoplastic resin such as an acryl-based resin, an epoxy-based resin, a cellulose-based resin, or a vinyl-based resin; a thermosetting resin such as an urethane resin that is crosslinked by adding polyisocyanate as a crosslinking agent to acrylpolyol or polyesterpolyol having a reactive hydroxyl group, a melamine-based resin, or a phenol-based resin; and an ionizing radiation (ultraviolet rays or electron beam) curing resin such as epoxy (meth)acryl or urethane (meth)acrylate are used independently or in combination. Further, in addition to the aforementioned resins, transparent resins released from the label base material may be properly used as well. These resins are formed within a range of about 1 to 20 μm by a variety of known coating methods such as gravure coating and hot-melt coating.

Third Embodiment

Figure 10A:
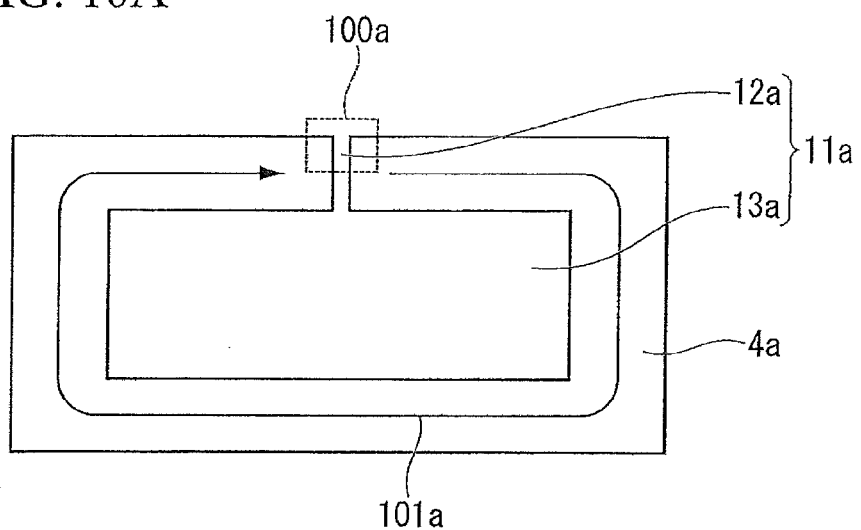
FIG. 10A is a plan view showing schematic configuration of an IC label according to a third embodiment of the present invention.

Next, a third embodiment of the present invention will be described. FIG. 10A is a plan view showing schematic configuration of a contactless IC label according to the third embodiment of the present invention.

In FIG. 10A, a rectangular cutout $13a$ is formed in the middle portion of a connecting layer $4a$. Further, a slit-shaped cutout $12a$ is formed from the middle portion of an upper side of the cutout $13a$ to the middle portion of an upper side of the connecting layer $4a$. An IC chip 5 is disposed on a region $100a$ so as to cross the cutout $12a$. Based on the impedance of a loop indicated by an arrow $101a$ in a cutout $11a$ of FIG. 10A (including the cutout $12a$ and the cutout $13a$) and the impedance of the IC chip 5, a shape of the cutout $11a$ is determined. For example, the shape of the cutout $11a$ is determined so that the impedance of the second loop indicated by the arrow $101a$ in the cutout $11a$ is equal to the impedance of the IC chip 5.

Fourth Embodiment

Figure 10B:
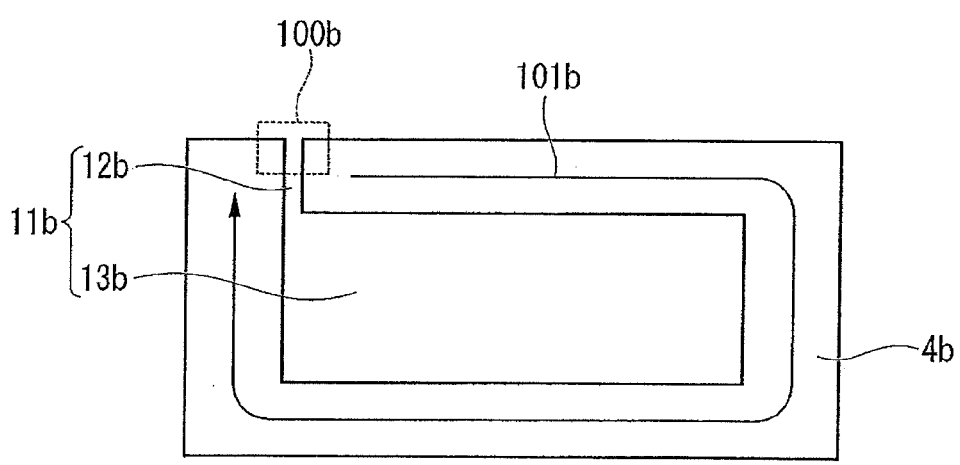
FIG. 10B is a plan view showing schematic configuration of an IC label according to a fourth embodiment of the present invention.

Next, a fourth embodiment of the present invention will be described. FIG. 10B is a plan view showing schematic configuration of a contactless IC label according to the third fourth embodiment of the present invention.

In FIG. 10B, a rectangular cutout $13b$ is formed in the middle portion of a connecting layer $4b$. Further, a slit-shaped cutout $12b$ is formed from the left end of an upper side of the cutout $13b$ to an upper side of the connecting layer $4b$. An IC chip 5 is disposed on a region $100b$ so as to cross the cutout $12b$. Based on the impedance of a loop indicated by an arrow $101b$ in a cutout $11b$ of FIG. 10B (including the cutout $12b$ and the cutout $13b$) and the impedance of the IC chip 5, a shape of the cutout $11b$ is determined. For example, the shape of the cutout $11b$ is determined so that the impedance of the loop indicated by the arrow $101b$ in the cutout $11b$ is equal to the impedance of the IC chip 5.

Fifth Embodiment

Figure 10C:
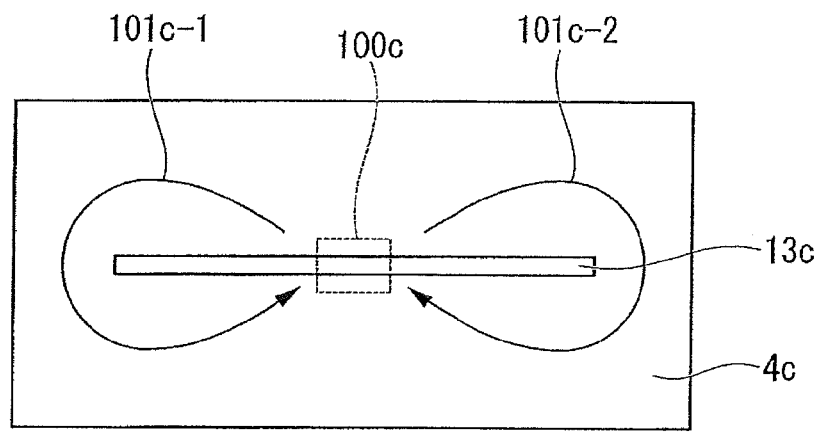
FIG. 10C is a plan view showing schematic configuration of an IC label according to a fifth embodiment of the present invention.

Next, a fifth embodiment of the present invention will be described. FIG. 10C is a plan view showing schematic configuration of a contactless IC label according to the fifth embodiment of the present invention.

In FIG. 10C, a slit-shaped cutout $13c$ is formed in the middle portion of a connecting layer $4c$. An IC chip 5 is disposed on a region $100c$ so as to cross the cutout $13c$. Based on a value of impedance combined by first and second loops indicated by arrows $101c$-1 and $101c$-2 in the cutout $13c$ of FIG. 10C and the impedance of the IC chip 5, a shape of the cutout $13c$ is determined. For example, the shape of the cutout $13c$ is determined so that the value of impedance combined by the first and second loops indicated by the arrows $101c$-1 and $101c$-2 in the cutout $13c$ is equal to the impedance of the IC chip 5.

Sixth Embodiment

Figure 10D:
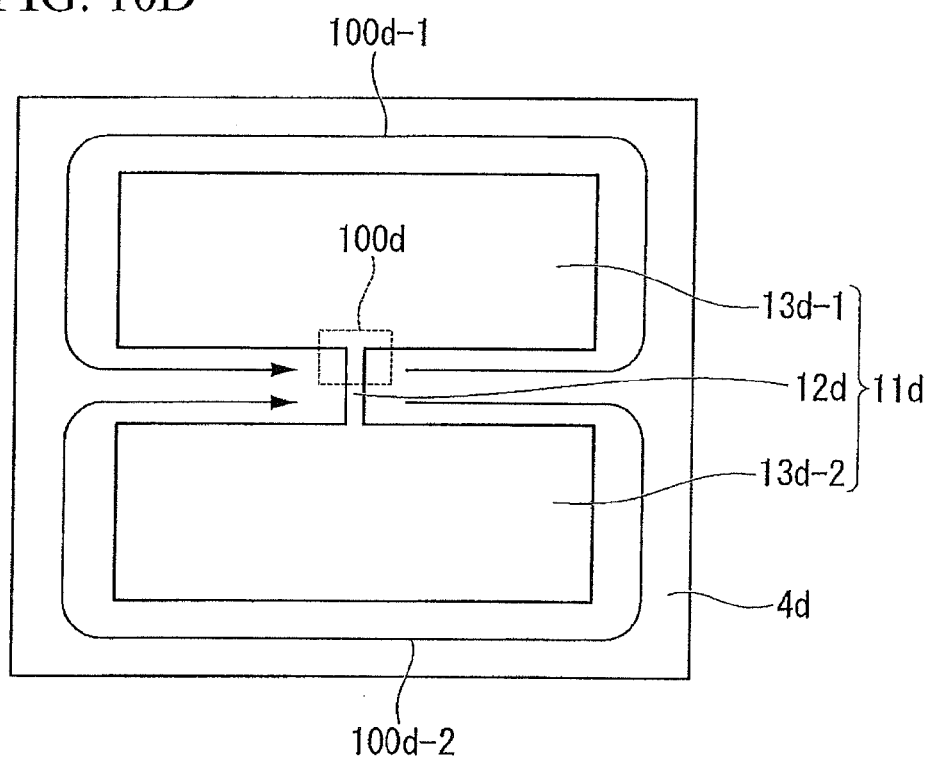
FIG. 10D is a plan view showing schematic configuration of an IC label according to a sixth embodiment of the present invention.

Next, a sixth embodiment of the present invention will be described. FIG. 10D is a plan view showing schematic configuration of a contactless IC label according to the sixth embodiment of the present invention.

In FIG. 10D, rectangular cutouts $13d$-1 and $13d$-2 are formed in upper and lower portion of a connecting layer $4d$. Further, a slit-shaped cutout $12d$ is formed from the middle portion of a lower side of the cutout $13d$-1 to the middle portion of an upper side of the cutout $13d$-2. An IC chip 5 is disposed on a region $100d$ so as to cross the cutout $12d$. Based on a value of impedance combined by first and second loops indicated by arrows $101d$-1 and $101d$-2 in a cutout $11d$ of FIG. 10D (including the cutout $12d$ and the cutouts $13d$-1 and $13d$-2) and the impedance of the IC chip 5, a shape of the cutout $11d$ is determined. For example, the shape of the cutout $11d$ is determined so that the value of impedance combined by the first and second loops indicated by the arrows $101d$-1 and $101d$-2 in the cutout lid is equal to the impedance of the IC chip 5.

Seventh Embodiment

Figure 11A:
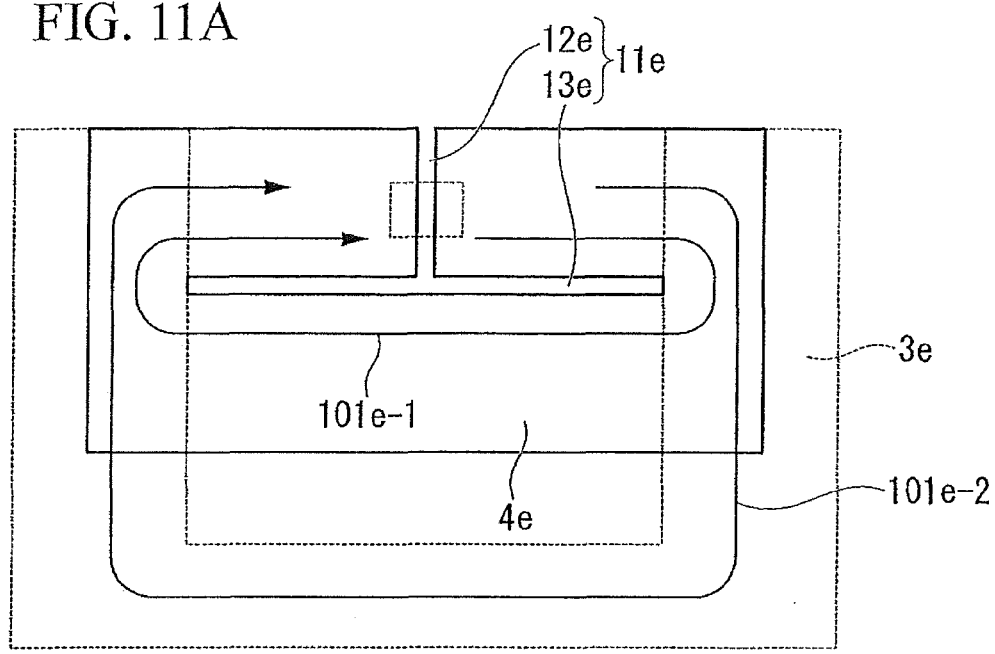
FIG. 11A is a plan view showing schematic configuration of an IC label according to a seventh embodiment of the present invention.

Next, a seventh embodiment of the present invention will be described. FIG. 11A is a plan view showing schematic configuration of a contactless IC label according to the seventh embodiment of the present invention.

In FIG. 11A, a slit-shaped cutout $13e$ is formed in the horizontal direction of a connecting layer $4e$. Further, a slit-shaped cutout $12e$ is formed from the middle portion of an upper side of the cutout $13e$ to the middle portion of an upper side of the connecting layer $4e$. Further, a U-shaped conductive layer $3e$ is formed on the connecting layer $4e$ via a shielding layer (not shown) and an insulating layer (not shown). Opposite ends of the connecting layer $4e$ and opposite ends of the conductive layer $3e$ are superposed on each other when viewed from the top, and undergo electrostatic coupling. An IC chip 5 is disposed on a region $100e$ so as to cross the cutout $12e$. Based on a value that combines the impedance of a loop indicated by an arrow $101e$-1 in a cutout $11e$ of FIG. 11A (including the cutout $12e$ and the cutout $13e$) with the impedance of a loop indicated by an arrow $101e$-2 in the conductive layer $3e$ and the impedance of the IC chip 5, a shape of the cutout $11e$ is determined. For example, the shape of the cutout $11e$ is determined so that the value that combines the impedance of the loop indicated by the arrow $101e$-1 in the cutout $11e$ with the impedance of the loop indicated by the arrow $101e$-2 in the conductive layer $3e$ is equal to the impedance of the IC chip 5.

Eighth Embodiment

Figure 11B:
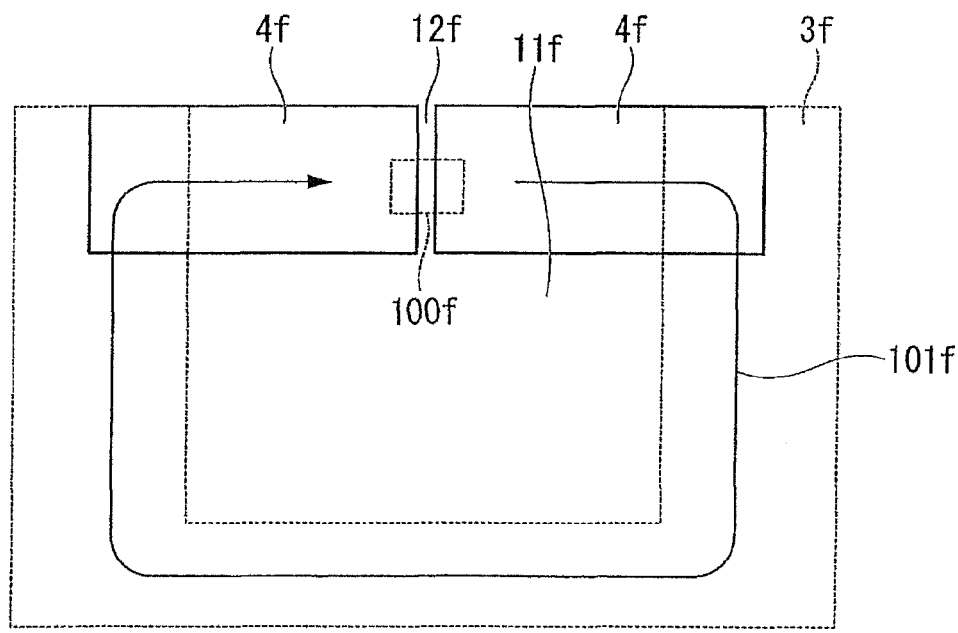
FIG. 11B is a plan view showing schematic configuration of an IC label according to an eighth embodiment of the present invention.

Next, an eighth embodiment of the present invention will be described. FIG. 11B is a plan view showing schematic configuration of a contactless IC label according to the eighth embodiment of the present invention.

In FIG. 11B, a slit-shaped cutout $12f$ is formed from the middle portion of a lower side of a connecting layer $4f$ to the middle portion of an upper side of the connecting layer $4f$. Further, a U-shaped conductive layer $3f$ is formed on the connecting layer $4f$ via a shielding layer (not shown) and an insulating layer (not shown). Opposite ends of the connecting layer 4f and opposite ends of the conductive layer 3f are superposed on each other when viewed from the top, and undergo electrostatic coupling. An IC chip 5 is disposed on a region 100f so as to cross a cutout 12f. Based on the impedance of a loop indicated by an arrow 101f in the cutout 12f of FIG. 11B and the impedance of the IC chip 5, a shape of a cutout 11f is determined. For example, the shape of the cutout 11f is determined so that the impedance of the loop indicated by the arrow 101f in the cutout 11f is equal to the impedance of the IC chip 5. Further, the cutout 11f is a region surrounded by the conductive layer 3 and the connecting layer 4, and additionally includes the cutout 12f.

Ninth Embodiment

Figure 12A:
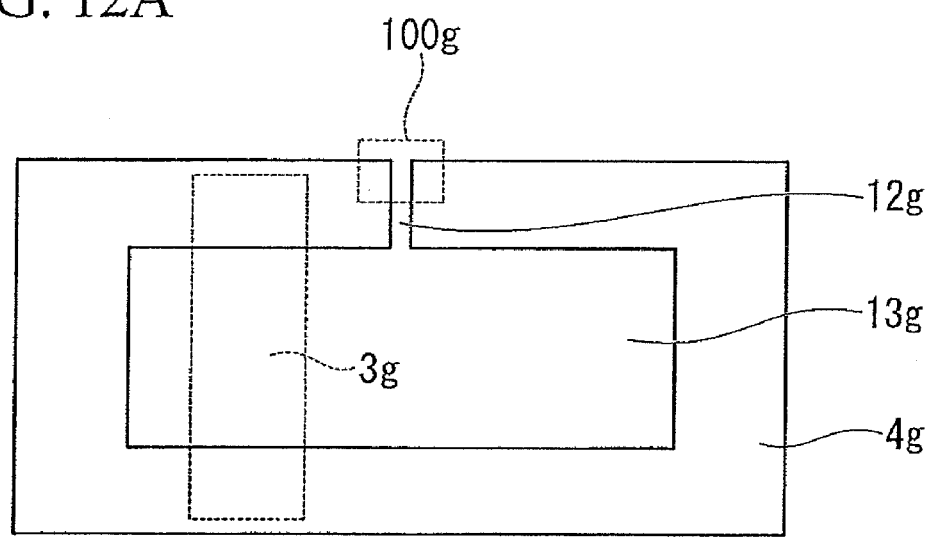
FIG. 12A is a plan view showing schematic configuration of an IC label according to a ninth embodiment of the present invention.

Next, a ninth embodiment of the present invention will be described. FIG. 12A is a plan view showing schematic configuration of a contactless IC label according to the ninth embodiment of the present invention.

In FIG. 12A, a rectangular cutout 13g is formed in the middle portion of a connecting layer 4g. Further, a slit-shaped cutout 12g is formed from the middle portion of an upper side of the cutout 13g to the middle portion of an upper side of the connecting layer 4g. Further, an I-shaped conductive layer 3g is formed on a left region of the connecting layer 4g via a shielding layer (not shown) and an insulating layer (not shown). Two points of the connecting layer 4g and opposite ends of the conductive layer 3g are superposed on each other when viewed from the top, and undergo electrostatic coupling. An IC chip 5 is disposed on a region 100g so as to cross the cutout 12g.

In the present embodiment, a path along which electric current flows when the connecting layer 4g is superposed on the conductive layer 3g when viewed from the top is shorter than a path along which electric current flows in the connecting layer 4g in a loop shape.

In the ninth embodiment, the path of the loop current is shortened by the superposition of the conductive layer 3, and impedance unmatching occurs with ease. However, when the ninth embodiment is combined with a fifteenth embodiment to be described below, it is possible to improve the communication characteristics.

Tenth Embodiment

Figure 12B:
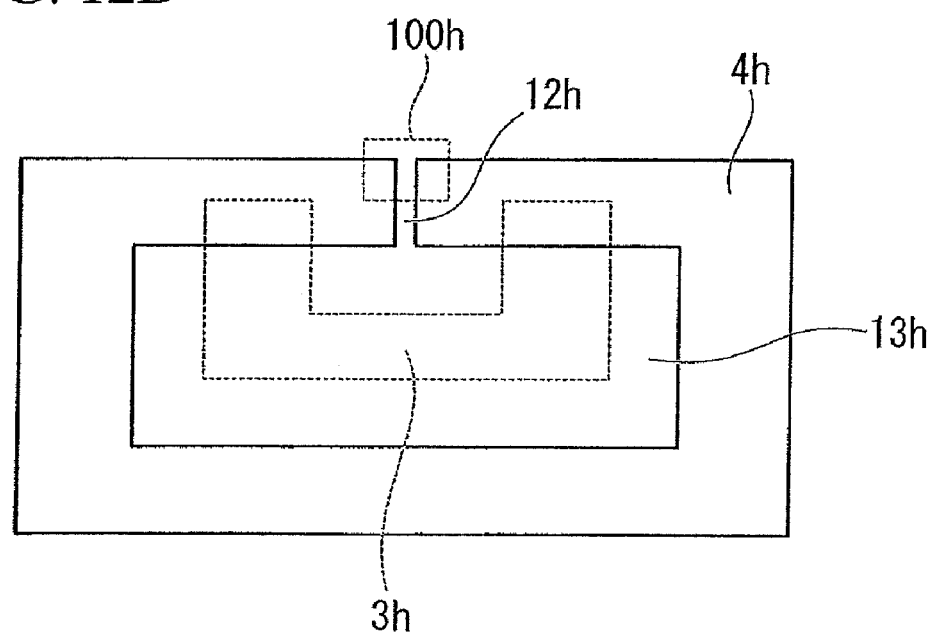
FIG. 12B is a plan view showing schematic configuration of an IC label according to a tenth embodiment of the present invention.

Next, a tenth embodiment of the present invention will be described. FIG. 12B is a plan view showing schematic configuration of a contactless IC label according to the tenth embodiment of the present invention.

In FIG. 12B, a rectangular cutout 13h is formed in the middle portion of a connecting layer 4h. Further, a slit-shaped cutout 12h is formed from the middle portion of an upper side of the cutout 13h to the middle portion of an upper side of the connecting layer 4h. Further, a U-shaped conductive layer 3h is formed within a region of the connecting layer 4h via a shielding layer (not shown) and an insulating layer (not shown). Two points of the connecting layer 4h and opposite ends of the conductive layer 3h are superposed on each other when viewed from the top, and undergo electrostatic coupling. An IC chip 5 is disposed on a region 100h so as to cross the cutout 12h.

In the present embodiment, a path along which electric current flows when the connecting layer 4h is superposed on the conductive layer 3h when viewed from the top is shorter than a path along which electric current flows in the connecting layer 4h in a loop shape.

In the tenth embodiment, the path of the loop current is shortened by the superposition of the conductive layer 3, and impedance unmatching occurs with ease. However, when the tenth embodiment is combined with a fifteenth embodiment to be described below, it is possible to improve the communication characteristics.

Eleventh Embodiment

Figure 12C:
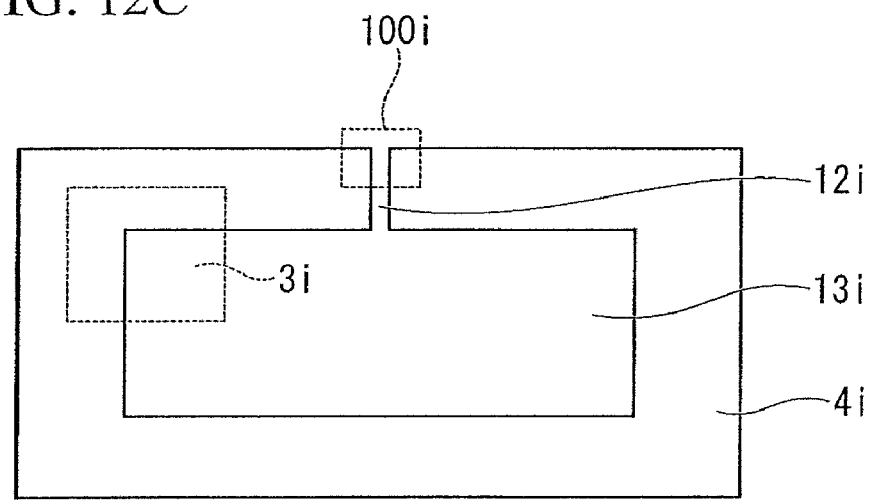
FIG. 12C is a plan view showing schematic configuration of an IC label according to an eleventh embodiment of the present invention.

Next, an eleventh embodiment of the present invention will be described. FIG. 12C is a plan view showing schematic configuration of a contactless IC label according to the eleventh embodiment of the present invention.

In FIG. 12C, a rectangular cutout 13i is formed in the middle portion of a connecting layer 4i. Further, a slit-shaped cutout 12i is formed from the middle portion of an upper side of the cutout 13i to the middle portion of an upper side of the connecting layer 4i. Further, a rectangular conductive layer 3i is formed within an upper left region of the connecting layer 4i via a shielding layer (not shown) and an insulating layer (not shown). A region where the connecting layer 4l is superposed on the conductive layer 3i when viewed from the top undergoes electrostatic coupling. An IC chip 5 is disposed on a region 100i so as to cross the cutout 12i.

In the present embodiment, a path along which electric current flows when the connecting layer 4i is superposed on the conductive layer 3i when viewed from the top is shorter than a path along which electric current flows in the connecting layer 4i in a loop shape.

In the eleventh embodiment, the path of the loop current is shortened by the superposition of the conductive layer 3, and impedance unmatching occurs with ease. However, when the tenth embodiment is combined with a fifteenth embodiment to be described below, it is possible to improve the communication characteristics.

Twelfth Embodiment

Figure 12D:
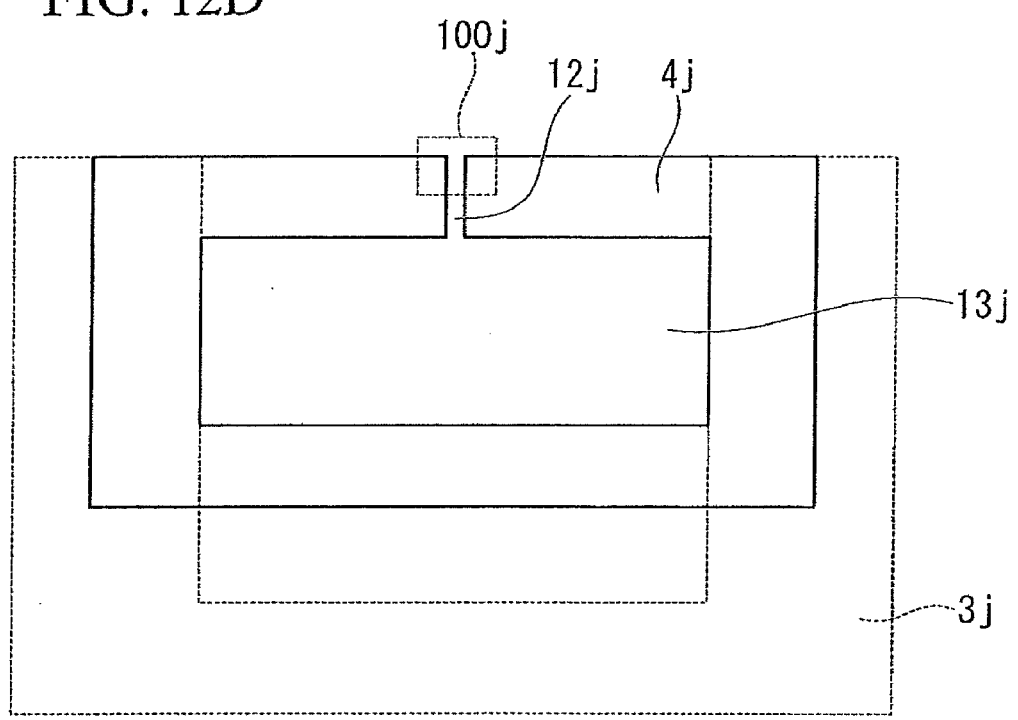
FIG. 12D is a plan view showing schematic configuration of an IC label according to a twelfth embodiment of the present invention.

Next, a twelfth embodiment of the present invention will be described. FIG. 12D is a plan view showing schematic configuration of a contactless IC label according to the twelfth embodiment of the present invention.

In FIG. 12D, a rectangular cutout 13j is formed in the middle portion of a connecting layer 4j. Further, a slit-shaped cutout 12j is formed from the middle portion of an upper side of the cutout 13j to the middle portion of an upper side of the connecting layer 4j. Further, a U-shaped conductive layer 3j is formed on opposite sides of the connecting layer 4j via a shielding layer (not shown) and an insulating layer (not shown). A region where the connecting layer 4j is superposed on the conductive layer 3j when viewed from the top undergoes electrostatic coupling. An IC chip 5 is disposed on a region 100j so as to cross the cutout 12j.

In the present embodiment, a path along which electric current flows via the conductive layer 3j is longer than a path along which electric current flows in the connecting layer 4j in a loop shape. Further, since the conductive layer is very thin and has high resistance, the path along which the electric current flows in the connecting layer 4j in the loop shape becomes predominant, and thus the superposition of the conductive layer does not cause impedance unmatching.

Thirteenth Embodiment

Figure 12E:
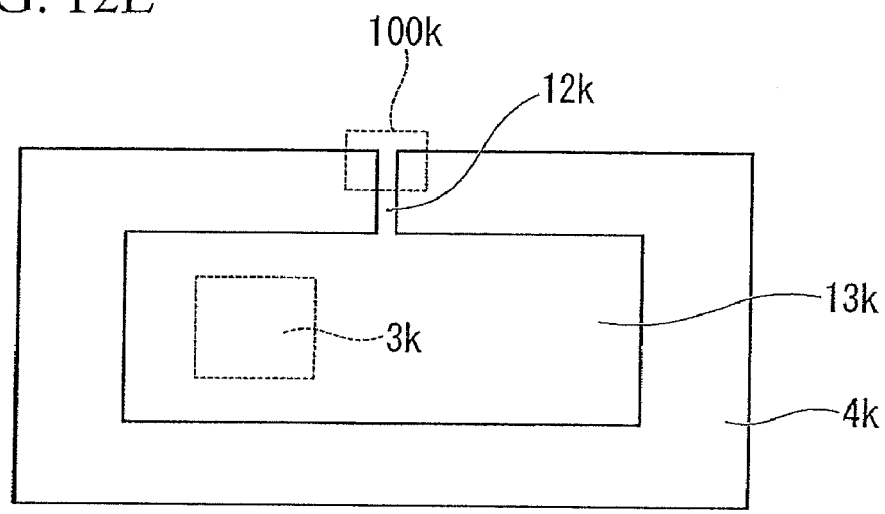
FIG. 12E is a plan view showing schematic configuration of an IC label according to a thirteenth embodiment of the present invention.

Next, a thirteenth embodiment of the present invention will be described. FIG. 12E is a plan view showing schematic configuration of a contactless IC label according to the thirteenth embodiment of the present invention.

In FIG. 12E, a rectangular cutout 13k is formed in the middle portion of a connecting layer 4k. Further, a slit-shaped cutout 12k is formed from the middle portion of an upper side of the cutout 13k to the middle portion of an upper side of the connecting layer 4k. Further, a dot-shaped conductive layer 3k is formed within a left region of the connecting layer 4k via a shielding layer (not shown) and an insulating layer (not shown). An IC chip 5 is disposed on a region 100k so as to cross the cutout 12k.

In the present embodiment, a path along which electric current flows when the connecting layer 4k is superposed on the conductive layer 3k when viewed from the top is equal to a path along which electric current flows in the connecting layer 4k in a loop shape, and the communication characteristics are good.

Fourteenth Embodiment

Figure 12F:
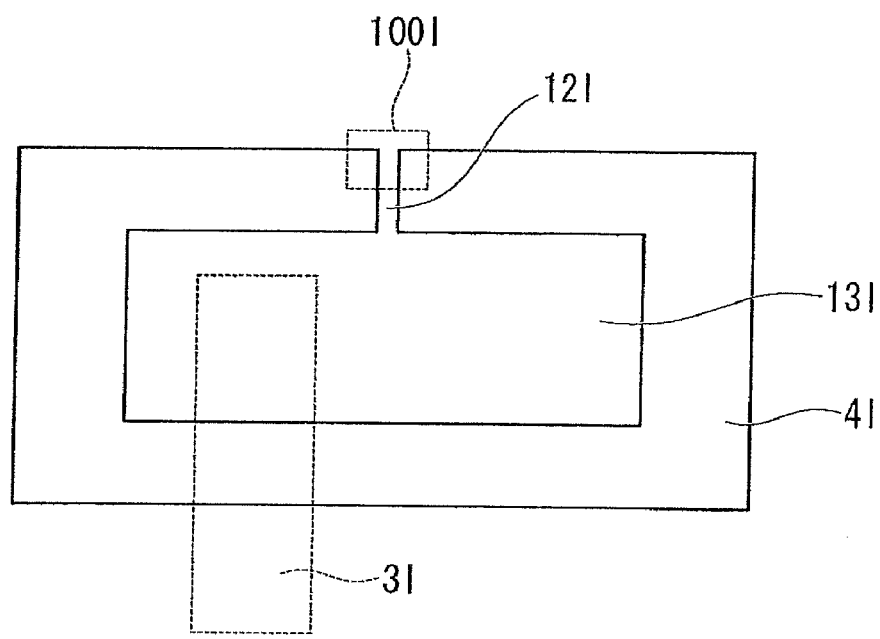
FIG. 12F is a plan view showing schematic configuration of an IC label according to a fourteenth embodiment of the present invention.

Next, a fourteenth embodiment of the present invention will be described. FIG. 12F is a plan view showing schematic configuration of a contactless IC label according to the fourteenth embodiment of the present invention.

In FIG. 12F, a rectangular cutout 13l is formed in the middle portion of a connecting layer 4l. Further, a slit-shaped cutout 12l is formed from the middle portion of an upper side of the cutout 13l to the middle portion of an upper side of the connecting layer 4l. Further, an I-shaped conductive layer 3l is formed so as to intersect a lower side of the connecting layer 4l via a shielding layer (not shown) and an insulating layer (not shown). A region where the connecting layer 4l is superposed on the conductive layer 3l when viewed from the top undergoes electrostatic coupling. An IC chip 5 is disposed on a region 100l so as to cross the cutout 12l.

In the present embodiment, a path along which electric current flows when the connecting layer 4l is superposed on the conductive layer 3l when viewed from the top is equal to a path along which electric current flows in the connecting layer 4l in a loop shape, and the communication characteristics are good.

Fifteenth Embodiment

Figure 13:
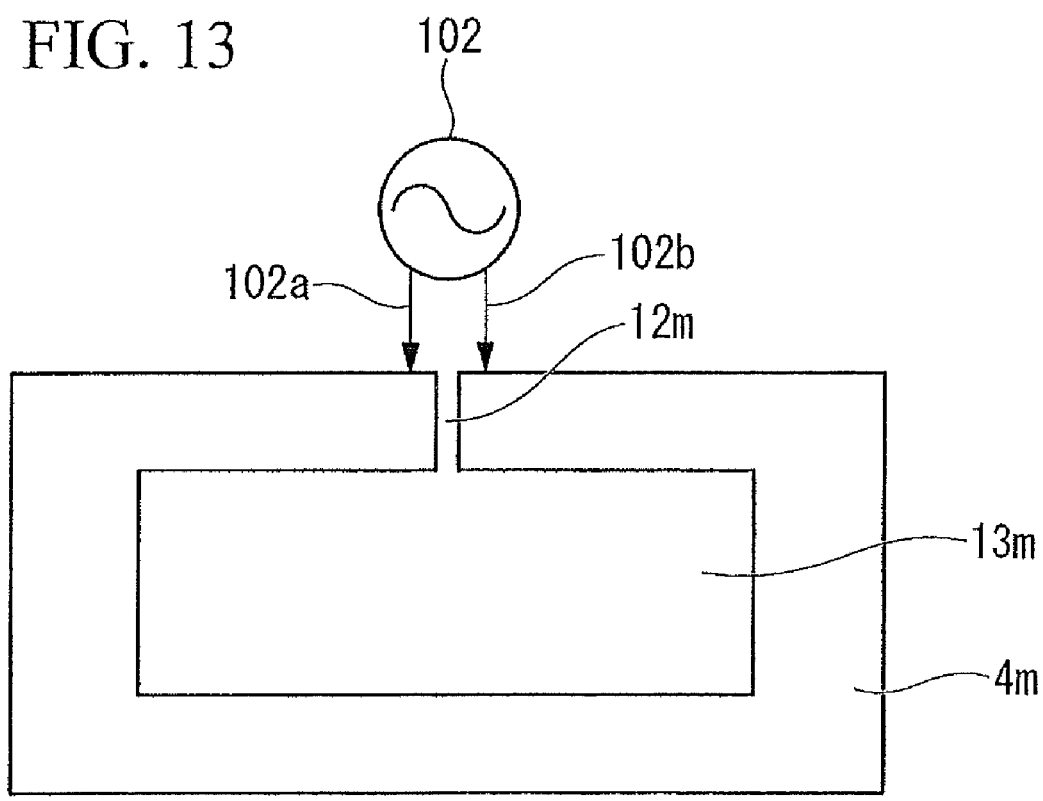
FIG. 13 is a descriptive view of an IC label according to a fifteenth embodiment of the present invention.

Next, a fifteenth embodiment of the present invention will be described. FIG. 13 is a descriptive view of a contactless IC label according to the fifteenth embodiment of the present invention.

In FIG. 13, a rectangular cutout 13m is formed in the middle portion of a connecting layer 4m. Further, a slit-shaped cutout 12m is formed from the middle portion of an upper side of the cutout 13m to the middle portion of an upper side of the connecting layer 4m. An IC chip 5 is disposed so as to cross the cutout 12m.

In the present embodiment, when shapes of the cutouts 12m and 13m are determined, high-frequency probes 102a and 102b of a network analyzer 102 are allocated to opposite ends of the connecting layer 4m, and then a reactance X of the connecting layer 4m is measured. When input impedance of an imaginary part of the IC chip 5 is set to −X', the shapes of the cutouts 12m and 13m are determined so as to meet a relationship of 0.9X'<X. Further, in the ninth to eleventh embodiments, with respect to the reactance X of the loop obtained when similar measurement is performed in superposition of the conductive layer, when the aforementioned condition, the relationship of 0.9X'<X, is met, more favorable communication characteristics are obtained.

Sixteenth Embodiment

Figure 14A:
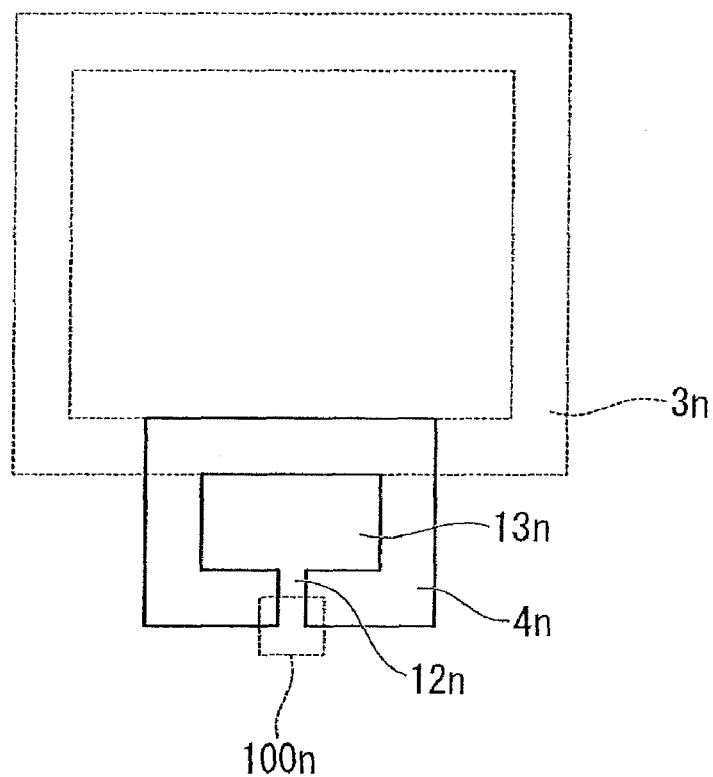
FIG. 14A is a plan view showing schematic configuration of an IC label according to a sixteenth embodiment of the present invention.

Next, a sixteenth embodiment of the present invention will be described. FIG. 14A is a plan view showing schematic configuration of a contactless IC label according to the sixteenth embodiment of the present invention. In FIG. 14A, a loop circuit of a connecting layer 4n is disposed outside a loop-shaped radiating element formed by a conductive layer 3n.

In FIG. 14A, a rectangular cutout 13n is formed in the middle portion of the connecting layer 4n. Further, a slit-shaped cutout 12n is formed from the middle portion of an lower side of the cutout 13n to the middle portion of a lower side of the connecting layer 4n. Further, an O-shaped conductive layer 3n is formed on the connecting layer 4n via a shielding layer (not shown) and an insulating layer (not shown). The upper side of the connecting layer 4n and the lower side of the conductive layer 3n are superposed on each other when viewed from the top, and undergo electrostatic coupling.

In the present embodiment, when electric current flows in the connecting layer 4n in a counterclockwise direction, electric current flows in the conductive layer 3n in a clockwise direction. Current paths of the connecting layer 4n and the conductive layer 3n are not included in each other, and thus magnetic fields formed by the both are not offset from each other and are spread widely, so that the communication characteristics become good.

Seventeenth Embodiment

Figure 14B:
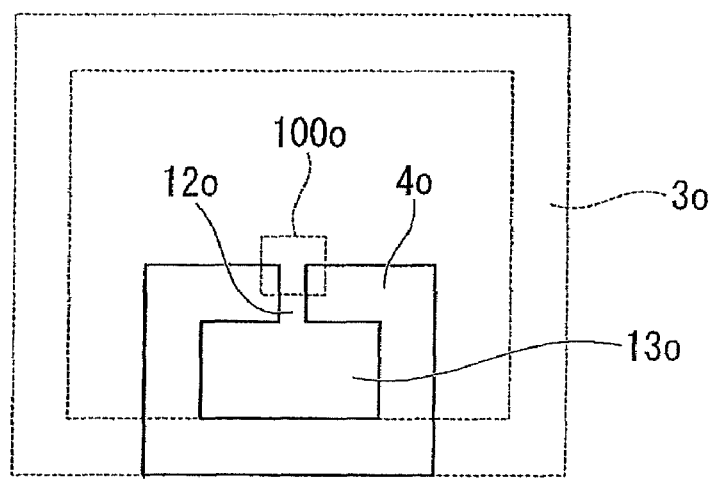
FIG. 14B is a plan view showing schematic configuration of an IC label according to a seventeenth embodiment of the present invention.

Next, a seventeenth embodiment of the present invention will be described. FIG. 14B is a plan view showing schematic configuration of a contactless IC label according to the seventeenth embodiment of the present invention.

In FIG. 14B, a rectangular cutout 13o is formed in the middle portion of a connecting layer 4o. Further, a slit-shaped cutout 12o is formed from the middle portion of an upper side of the cutout 13o to the middle portion of an upper side of the connecting layer 4o. Further, an O-shaped conductive layer 3o is formed on the connecting layer 4o via a shielding layer (not shown) and an insulating layer (not shown). The upper side of the connecting layer 4o and a lower side of the conductive layer 3o are superposed on each other when viewed from the top, and undergo electrostatic coupling.

In the present embodiment, when electric current flows in the connecting layer 4o in a counterclockwise direction, electric current flows in the conductive layer 3o in a clockwise direction. A current path of the conductive layer 3o completely includes that of the connecting layer 4o, and thus magnetic fields formed by the both are offset from each other, so that the communication characteristics are deteriorated.

Further, in each embodiment described above, as the shielding layer 8 (FIG. 3), an organic polymer resin presenting no conductivity is used, but a high heatproof material (resin) having Tg of 180° C. or more may be used particularly based on the following points (I) to (III).

(I) Shielding Effect of Making Connecting Layer Invisible Under Visible Rays

Since only the OVD functional layer 6 is seen from the surface by this effect, it is possible to enhance the design. Moreover, since a degree of freedom of the design of the conductive layer 3 is also raised, it is also possible to improve the communication characteristics. As a material of the shielding layer 8, any colored material may be used. Typical ink is used, but it is preferable that ink colored with a pigment, carbon black, or the like having high heat resistance and light resistance is printed.

(II) Improvement of bonding Strength of IC Chip

Figure 15:
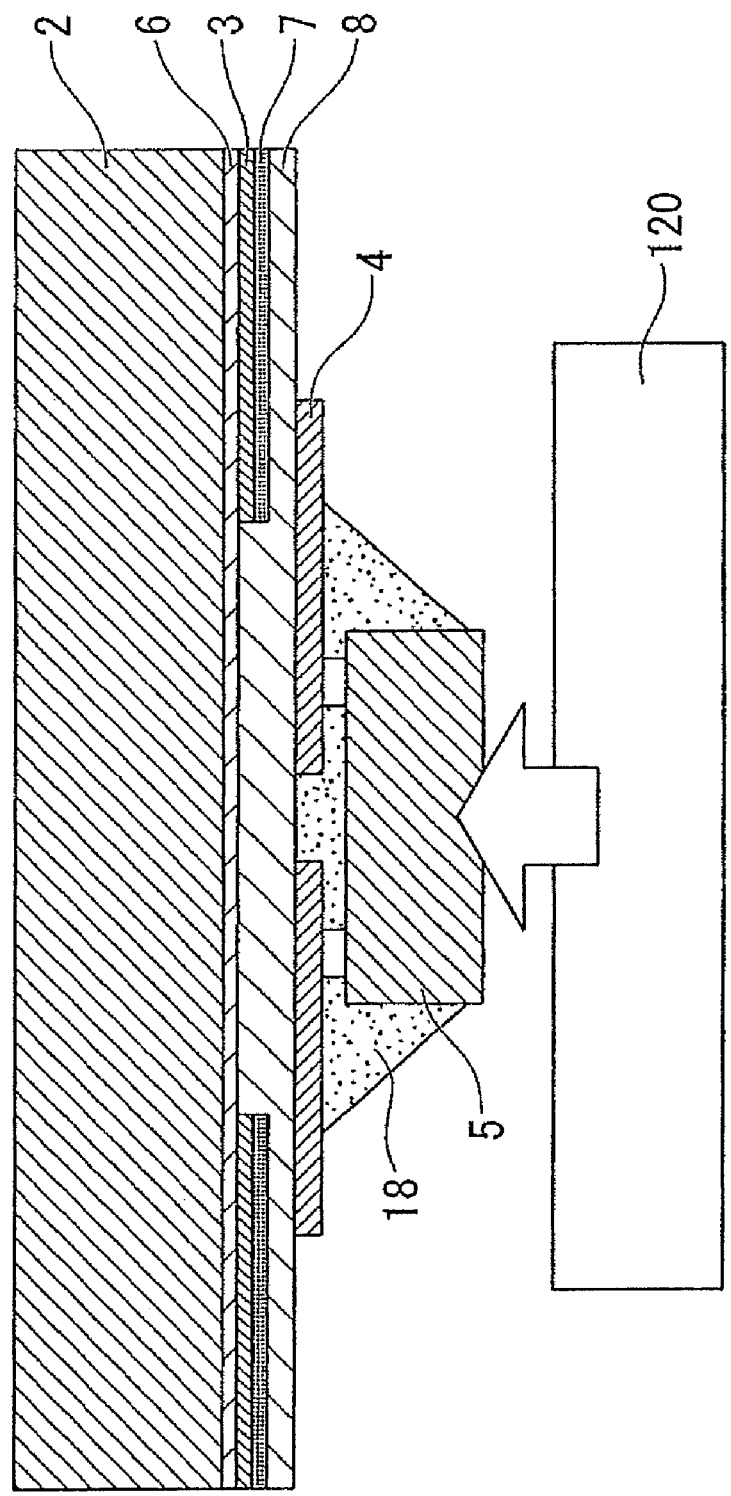
FIG. 15 is a view showing an example of a method of manufacturing a shielding layer.

In particular, in the case of ACP bonding, when the IC chip is mounted on the connecting layer 4, heat of 180° C. or more and pressure of about 75 gf require tens of seconds from a metal head 120 larger than the IC chip 5 in the mounting process (see FIG. 15). As such, the heat resistance of the shielding layer 8 becomes important. Without the heat resistance, the shielding layer 8 melts. As such, a cohesion failure occurs inside the shielding layer 8, and the adhesion of the IC chip 5 is reduced. Meanwhile, when the high heatproof resin (having Tg of 180° C. or more) is used, the shielding layer 8 does not melt, and the cohesion failure does not occur in the shielding layer 8. As such, the cohesion failure inside the shielding layer 8 is suppressed. Accordingly, the bonding strength of the IC chip 5 is improved.

(III) Prevention of Whitening of OVD Image and Contraction of Label Base Material In particular, in the case of ACP bonding, when the IC chip 5 is mounted on the connecting layer 4, heat of 180° C. or more and pressure of about 75 gf require tens of seconds from a metal head 120 larger than the IC chip 5 in the mounting process (see FIG. 15). For this reason, it is preferable to provide the shielding layer 8 with heat resistance. Without the heat resistance, the OVD functional layer is deformed (fused) by the heat in the mounting process. As such, the OVD image becomes whitened and turbid. Further, thermal contraction of the label base material 2 is also increased, and the label itself is twisted. Meanwhile, when the high heatproof resin (having Tg of 180° C. or more) is used, thermal conduction is suppressed by the shielding layer 8, and thus deformation of the OVD functional layer 6 is suppressed. Moreover, since the contraction of the base material is suppressed, it is possible to produce a visual effect of the OVD functional layer 6 to the utmost.

As described above, a material (an organic polymer resin) that considers the roles of (I) to (III) includes, for example, a thermoplastic resin having a high Tg such as a polyacrylate resin, a polyimide resin, or a polyamideimide resin; a thermosetting resin such as cross-linked an urethane resin, an epoxy resin, a melamine-based resin, or a phenol-based resin; and an ionizing radiation (ultraviolet rays or electron beam) curing resin such as epoxy(meth)arcyl, or urethane (meth) arcylate. In FIG. 16, when a predetermined resin is used for the shielding layer 8, heatproof temperature, adhesion, and whitening of the hologram and contraction of the base material are shown as a table.

Further, the insulating layer functions to perform capacitive coupling on the conductive layer 3 and the connecting layer 4, and may be formed of a material that does not produce electrical conductivity. For example, the following configurations of (1) to (3) are considered as the insulating layer:

(1) only mask layer 7;
(2) only shielding layer 8; and
(3) mask layer 7+shielding layer 8.

Further, in the case of configuration (2), a demetallizing process is possible without the mask layer using a water-soluble resin (a method of washing away a water-soluble resin portion), a leather demeter (a method of partially destructing a conductive thin film using a leather), or the like. Further, the insulating layer may be formed by the mask layer and the shielding layer.

However, the insulating layer may be formed so that only its portion deposited on the impedance adjusting unit exhibits non-conductivity and the other portion exhibits conductivity.

Further, in each embodiment described above, the description has been made with reference to the example where the conductive layer 3 is directly formed on the label base material 2. Alternatively, the conductive layer may be formed by forming a metal deposition film on a film-like base material in a desired shape and by bonding it with the label base material 2. In this case, both the metal deposition film and the OVD functional layer 6 are also formed on the base material, so that a label holding an effect of OVD functionality can be obtained.

Further, instead of directly forming the connecting layer 4 on the lower surface of the conductive layer 3, a metal thin film may be formed on one surface of a base material made of a sheet-shaped insulating material by sputtering or deposition, or a conductive layer may be formed by a method such as printing using conductive paste, thereby functioning as a connecting layer. An IC chip may be mounted on the connecting layer, thereby forming an inlet. The inlet may be bonded to the lower surface of the shielding layer 8. Thereby, the IC label may be formed.

However, when the connecting layer is directly formed on the lower surface of the conductive layer by printing, it is difficult to extract only the connecting layer and the IC chip as the inlets from the IC label. Thus, this is preferable because the counterfeit of the IC label becomes more difficult, and the security can be enhanced.

In addition, in each embodiment described above, the description has been made with reference to the example where the shielding layer 8 is formed on the entire lower surface of the label base material 2. Alternatively, the shielding layer may be partially formed so as to cover only the connecting layer 4 and the IC chip 5.

While the embodiments of the present invention have been described, they should not be interpreted as limiting for the technical range of the present invention. Accordingly, various changes and alternations can be made herein without departing from the subject matter of the present invention.

REFERENCE SYMBOLS 1, 1A, 1B: contactless IC label
2: label base material
3, 3B: conductive layer
4: connecting layer
5: IC chip
6: functional layer (optical variable device)
7: mask layer (insulating layer)
8: shielding layer
11: impedance adjusting unit
12: first slit
13: second slit

The invention claimed is:

1. A contactless integrated circuit (IC) label that has an IC chip and is capable of exchanging data with an external reading device without contact, the contactless IC label comprising:

a transparent label base material;
an optical variable device formed on a lower surface of the label base material;
a conductive layer formed as a metal deposition film, bonded to and formed on a lower surface of the optical variable device, and configured to function as an antenna of the IC chip;
a connecting layer electrically connected to the IC chip;

an insulating layer formed between the conductive layer and the connecting layer, and configured to electrically couple the conductive layer and the connecting layer; and an impedance adjusting unit formed on at least the connecting layer of the conductive layer and the connecting layer, and configured to adjust impedances of the conductive layer and the IC chip, the conductive layer formed in a desired shape by performing a demetallization process of partially removing a metal deposition thereof.

2. The contactless IC label according to claim 1, wherein the impedance adjusting unit comprises a first loop circuit formed by a cutout that is formed in the connecting layer.

3. The contactless IC label according to claim 2, wherein the impedance adjusting unit comprises a second loop circuit formed by the connecting layer, the conductive layer, and a capacitive coupler configured to electrically connect the connecting layer and the conductive layer.

4. The contactless IC label according to claim 3, wherein the second loop circuit is longer than or equal to the first loop circuit.

5. The contactless IC label according to claim 1, further comprising an insulating shielding layer formed between the conductive layer and the connecting layer, the insulating shielding layer making the connecting layer invisible when viewed from the label base material side under visible rays.

6. The contactless IC label according to claim 5, wherein the shielding layer is formed of a material whose heatproof temperature is 180° C. or more.

7. The contactless IC label according to claim 1, wherein the IC chip records a non-rewritable identification code.

8. The contactless IC label according to claim 1, further comprising a release layer formed between the label base material and the optical variable device.

9. The contactless IC label according to claim 1, wherein:
the conductive layer has a thickness greater than or equal to 10 nm and less than 1 μm; and
the connecting layer has a thickness ranging from 1 μm to 20 μm.

10. The contactless IC label according to claim 9, wherein the conductive layer has a thickness ranging from 20 nm to 200 nm.

11. The contactless IC label according to claim 9, wherein the connecting layer has a thickness ranging from 2 μm to 10 μm.

12. An article to which a contactless integrated circuit (IC) label is adhered, the contactless IC label comprising:
a transparent label base material;
an optical variable device formed on a lower surface of the label base material;
a conductive layer formed as a metal deposition film, bonded to and formed on a lower surface of the optical variable device, and configured to function as an antenna of the IC chip;
a connecting layer electrically connected to the IC chip;
an insulating layer formed between the conductive layer and the connecting layer, and configured to electrically couple the conductive layer and the connecting layer; and
an impedance adjusting unit formed on at least the connecting layer of the conductive layer and the connecting layer, and configured to adjust impedances of the conductive layer and the IC chip,
the conductive layer formed in a desired shape by performing a demetallization process of partially removing a metal deposition thereof.

* * * * *